(12) United States Patent
Peigo et al.

(10) Patent No.: US 12,342,493 B2
(45) Date of Patent: Jun. 24, 2025

(54) DATA CENTER MODULE FORMED FROM PREFABRICATED AND TRANSPORTABLE SEGMENTS, DATA CENTER MODULE CONSTRUCTION METHOD, DATA CENTER FORMED FROM SAID MODULE, AND DATA CENTER CONSTRUCTION METHOD

(71) Applicant: MODULAR DATA CENTERS INDÚSTRIA COMÉRCIO E SERVIÇOS S.A.

(72) Inventors: Marcos Vinicius Bernardes Peigo, Barueri (BR); Franciele Nogueira Ferreira Rosa, Bom Jesus dos Perdões (BR); Eugenio Couto Cruz, São Paulo (BR)

(73) Assignee: Modular Data Centers Industria Comercio E Servicos S.A., Cotia (BR)

( * ) Notice: Subject to any disclaimer, the term of this patent is extended or adjusted under 35 U.S.C. 154(b) by 239 days.

(21) Appl. No.: 17/985,289

(22) Filed: Nov. 11, 2022

(65) Prior Publication Data

US 2023/0397360 A1    Dec. 7, 2023

(51) Int. Cl.
*H05K 7/00*    (2006.01)
*H05K 7/14*    (2006.01)

(52) U.S. Cl.
CPC .................. *H05K 7/1497* (2013.01)

(58) Field of Classification Search
CPC .......... H05K 7/00; H05K 7/14; H05K 7/1427; H05K 7/1485; H05K 7/1497
See application file for complete search history.

(56) References Cited

U.S. PATENT DOCUMENTS

| | | | | |
|---|---|---|---|---|
| 10,143,105 | B1 * | 11/2018 | Ziegler | H05K 7/1457 |
| 10,398,061 | B1 * | 8/2019 | Ross | G06F 1/206 |
| 10,582,635 | B1 * | 3/2020 | Ross | G06F 1/189 |
| 10,999,954 | B2 * | 5/2021 | Rančić | E04H 5/00 |
| 11,039,551 | B1 * | 6/2021 | Bailey | H05K 7/20145 |
| 11,382,232 | B1 * | 7/2022 | Madhavkant | H05K 7/1487 |

(Continued)

FOREIGN PATENT DOCUMENTS

EP    2648496 A2    10/2013

*Primary Examiner* — Chi Q Nguyen
(74) *Attorney, Agent, or Firm* — The Dobrusin Law Firm, PC

(57) ABSTRACT

A data center module is formed from prefabricated and transportable segments, constructed by joining two substantially symmetrical halves. Each half comprises one or more prefabricated segments, transported individually as standard cargo and joined end-to-end to form the halves, which are then joined to form the module. The module includes a main aggregation aisle and a dedicated, segregated room with a substantially parallelepiped shape housing a racks area. A first door with access control allows authorized circulation between the main aggregation aisle and the racks area. A second door with access control provides access to the power supply system room, facilitating authorized movement between the main aggregation aisle and the power supply system. The module also includes a cooling system room. A data center is constructed by arranging modules side-by-side. A construction method involves assembling a housing, inserting segments into the housing, and arranging modules within the housing.

10 Claims, 13 Drawing Sheets

(56) References Cited

U.S. PATENT DOCUMENTS

| | | | |
|---|---|---|---|
| 2008/0055850 A1* | 3/2008 | Carlson | H05K 7/20136 |
| | | | 361/695 |
| 2008/0094797 A1* | 4/2008 | Coglitore | H05K 7/20745 |
| | | | 361/679.5 |
| 2012/0033377 A1* | 2/2012 | Salpeter | H05K 7/1497 |
| | | | 361/679.02 |
| 2012/0125028 A1 | 5/2012 | Keisling et al. | |
| 2020/0084912 A1* | 3/2020 | Slessman | H05K 7/2059 |
| 2020/0146186 A1 | 5/2020 | Fotouh | |
| 2021/0153375 A1* | 5/2021 | Bailey | H05K 7/1497 |
| 2023/0209764 A1* | 6/2023 | Roy | H05K 7/20836 |
| | | | 52/1 |
| 2024/0028677 A1* | 1/2024 | Crawford | G06F 21/31 |

\* cited by examiner

DATA CENTER MODULE FORMED FROM PREFABRICATED AND TRANSPORTABLE SEGMENTS, DATA CENTER MODULE CONSTRUCTION METHOD, DATA CENTER FORMED FROM SAID MODULE, AND DATA CENTER CONSTRUCTION METHOD

FIELD OF THE INVENTION

The present invention refers to the field of modular centers for data processing (or simply data centers) that house computer systems [IT (Information Technology) equipment] of one or more organizations.

In particular, the present invention refers to modular and scalable data centers, while meeting the specifications and efficiency guarantees of a conventional (non-modular) data center.

Thus, the present invention provides a scalable, replicable and customizable data center based on modules constructed on site. However, after the data center is constructed, the user experience is similar to that of a conventional data center built using masonry.

Even more specifically, the present invention refers to a module provided with prefabricated and transportable segments that are constructed at the location of the data center, with said segments comprising a metallic frame, which is constructed at the location of construction to form a module.

These modules form a data center that is further housed by a housing. Said housing comprises a cover which may have a raised floor, side portions which limit the data center area, further comprising a facade and convenience services areas built using masonry or other materials commonly used in conventional data centers.

BACKGROUND ART

Currently, in the age of the knowledge society, data centers are structures of greatest importance, as they are where all information of an organization is stored and protected. Thus, the function of a data center is to house servers, telecommunication equipment and operation support areas.

Due to the growing market demand for this type of infrastructure, there is an increasing need for a fast and flexible construction of data centers in practically the whole world.

In order to facilitate the construction, there are in the prior art modular data centers having a prefabricated structure, which already include, among others, IT rack cabinets, cooling, uninterruptible power supplies (UPSs), power distribution units, cables and connections, monitoring, lighting, door access control, etc.

However, the modular data centers from prior art have presented some technical problems, such as, for example, low flexibility, because they are designed for a finite and static capacity. In other words, for modular data centers from prior art, it is difficult to expand the capacity, in addition to being equally complex to adapt the flexibly to changes in market demands.

In summary, modular processing data centers are already known in the prior art. However, there are some difficulties and inconveniences, such as restriction of rack capacity, energy potential, and cooling equipment in the same area as the customer's equipment. These limitations make replicable use unfeasible to meet the large demands of data centers and their varied technical specifications.

Currently, in prior art, there are modular, prefabricated data centers having cooling and power systems attached to the racks areas, however without guaranteeing integration, not even with expandability and redundancy to mimic a conventional data center having all its capacity advantages.

An example of a conventional data center limitation: a data center having space for 200 racks and which starts its operation with only 10 racks is not efficient, as the racks mobilize capital for an infrastructure that is not being used (with no return of the capital invested at the beginning of its operation).

In addition, when an incident occurs in a large conventional data center, it can impact all racks in the same room.

Another problem with conventional data centers is the average time to build an installation, which varies from 18 to 24 months, without unforeseen events.

As some equipment (or its parts) that form the infrastructure are imported, variables such as installation planning for non-standard spaces, negotiation time with foreign suppliers, complexity and delays related to licensing processes with public bodies, risks involving transport logistics, and delays in customs clearance are some of the obstacles that invariably cause delays in the completion of conventional data centers.

The present invention provides technical advantages that conventional large data centers do not have—expansion flexibility, optimized initial deployment cost, cost proportional to data center growth, and convenience services areas to support customer operation. In other words, the present invention manages to combine the advantages of modular data centers with the advantages of large conventional data centers and, furthermore, mitigating the disadvantages of a conventional data center.

Currently, simple data such as numbers and text are no longer processed (as in the past), but all types of data, such as audio, images, videos, in a big data perspective, thus generating an exponential demand for data processing.

These technological advances have demanded a growing need for improvements in infrastructure of modular data centers. Because of the high power and high density required today, modular data centers are using simple and pre-defined systems of downflow, roomcool or cold containment aisle, making it a challenge to keep up with the exponentially growing need for the increasingly demanded high power.

Another disadvantage of data centers from prior art is their high cost, especially in the early stages of construction.

Furthermore, there are customers with non-optimized infrastructure having low consumption density per rack, which disadvantageously results in underutilization of the dimensioned environment, leading to lower data center efficiency (which leads to higher power consumption).

Conventional data centers, on the other hand, are designed to operate under optimal conditions (close to full capacities). These optimal conditions of conventional data centers may not be achieved at the beginning of the operation. This is the big disadvantage of conventional data centers, the initial cost of deployment. Due to the proportion, the conventional data center needs to have the racks area fully active, since the partial initial use results in higher costs proportional to its size.

On the other hand, the modular data centers from prior art cannot have large rack capacities, because they have potential constraint, energy potential restrictions, redundancy, and cooling equipment, among other limitations.

The patent document US 20200146186 describes a modular data center capable of being transported on a highway, already with IT racks, electrical distribution system, uninterruptible power supply (UPS) batteries and heating/ventilation/air-conditioning (HVAC) system pre-installed. Thus, a manufacturer can ship a modular data center as an integrated unit. The modular data center includes a prefabricated telecom data center or other modularly designed data centers.

However, the US document itself reveals the limitation of these data centers: the only limit is the cargo shipping limit. That is, the size of the modules is limited by the transport regulations established in the jurisdiction in which the data center will be transported.

Advantageously, the prefabricated modules of the present invention are capable of being transported in any jurisdiction, to form large-scale modular data centers, and having all the advantages of a conventional large-scale data center, such as for example redundancy and integration.

Furthermore, these advantages can be found in the air containment system described in the patent document US 20200146186, which includes one or more HVAC units attached to the concrete side walls of the modular data center and air plenums attached to the concrete side walls.

This invention advantageously provides a housing that avoids direct sunlight, which increases the efficiency of the cooling system, in addition to providing a greater volume of air by joining two halves to form the module of the present invention.

The patent document EP 2648496 also refers to high-density data center modules having an efficient cooling system. This cooling system allows the use of a hot aisle and a cold aisle through which air circulates to cool the server racks.

The document EP 2648496 also describes an aggregation aisle between the modules, but it is not able to integrate the electrical system areas of each module. The aisle from this EP document has the function of providing air circulation, and not exactly the integration of a data center.

In view of these prior art challenges, i.e., reducing the construction time of conventional data centers, reducing the risks of delays and widespread compromise of racks that form large rooms in conventional (traditional) data centers, the present invention is now disclosed below.

OBJECTIVES OF THE INVENTION

The present invention has as main objectives:
reduction in average construction time, compared to conventional data centers, by up to 8 months;
better energy efficiency than the modular data centers from prior art;
risk reduction with the downtime of hundreds of racks that share the same cooling system, compared to conventional and modular data centers from prior art;
improvements in logistics compared to the modular data centers from prior art, as the transport of segments can be carried out without the need for special transport authorizations, as occurs with non-standard cargo (which exceed regulatory dimensions);
redundancy for cooling and electrical equipment per module, and capability to share resources between modules, optimizing overall redundancy compared to the modular data centers from prior art;
a circulation aisle that facilitates the circulation of customers and users, as an improvement to the current offer of modular data centers;
equipment maintenance, without the need for access to the racks area compared to current conventional and modular data center offerings; this same improvement restricts customer and visitor access to equipment vital to operations.

The present invention makes it possible to combine the advantages of a conventional data center with those of modular data centers.

In this way, the present invention is advantageously scalable, having high capacity to support data processing equipment, wherein the prefabricated modules allow reduction of construction time, a favorable logistics, a greater technical flexibility, a reduction of initial investments and risks presented by data centers from prior art.

SUMMARY OF THE INVENTION

The module of the present invention has a substantially parallelepiped shape, provided at one of its ends with a dedicated and segregated room in substantially parallelepiped shape in order to house a power supply system and, at its opposite end, a dedicated and segregated room in substantially parallelepiped shape in order to house a cooling system.

The module of the present invention comprises joining two substantially symmetrical halves in relation to a longitudinal plane perpendicular to a floor, wherein each half comprises joining one or more of their respective prefabricated and transportable segments.

Between the power supply system room and the cooling system room, the module of the present invention is provided with a main aggregation aisle and a dedicated and segregated room in substantially parallelepiped shape to house a racks area.

An access first door to the racks, provided with an access control, allows the circulation of authorized users between the main aggregation aisle and the racks area. An access second door to the power supply system room, also provided with an access control, allows the circulation of authorized users between the main aggregation aisle and the power supply system room.

Access to the main aggregation aisle is controlled and carried out through a convenience services area.

The joining between the first half and the second half forms a hot or cold air containment aisle common to both halves.

The halves are autonomous, thus there is optimization of redundancy of the cooling equipment when the halves are combined.

Each of the halves can share with each other their cooling equipments that are on standby.

Each of the halves is autonomous, consequently there is also the optimization of equipment redundancy in the electrical power supply systems.

The present invention further discloses a construction method for a module comprising the following steps:
the segments are manufactured in a different location than the module deployment location;
each of the segments is transported individually as standard cargo to the module construction location;
at the module construction location, the end of one segment is joined to the other end of the adjacent segment to form the first half,
at the module construction location, the end of one segment is joined to the other end of the adjacent segment to form the second half, wherein the halves are substantially symmetrical;
after formation of each of the halves, the first half is joined to the second half to form the module.

The construction method for a module further comprises one or more modules arranged side by side and interconnected from the larger side faces of adjacent modules, with the main aggregation aisle being aligned between the modules.

The first module of the data center is arranged next to the convenience services area, and user access control to one or more modules is carried out through said convenience services area.

The present invention also discloses a data center provided with a housing, limited at the bottom by a floor raised in relation to the ground level, where the aforementioned data center will be mounted; the housing, which is limited at the top by a cover, houses the data center in whole or in part; the same housing is limited laterally and at the bottom respectively by closures, wherein at least one of said closures is carried out by means of gates compatible at least with the dimensions of the segments; the housing is also frontally limited by the convenience services area, which is integrated to the housing in order to constitute the same data center.

The present invention further discloses a construction method for a data center, comprising the steps, in any order:
- a) Construction of the housing, constructed from execution of the following sub-steps performed in any order:
  - Construction of a solid base or floor raised from the ground where the data center will be constructed;
  - construction of the convenience services area;
  - construction of the cover structure;
  - placement of the cover or use of an existing one;
  - implementation of side closures;
  - bottom closing;
- b) Insertion of the segments inside the housing, which are constructed from the execution of the following sub-steps performed in any order:
  - first segments are joined to form a first half;
  - segments substantially symmetrical to the first segments are joined to form a second half substantially symmetrical to the first half,
  - after formation of each of the halves, a first half is joined to the second half, forming the module;
- c) The modules are arranged side by side inside the housing to form the modular data center.

BRIEF DESCRIPTION OF THE DRAWINGS

FIG. 17 is a flowchart illustrating the steps of a method for assembling the data center.

DETAILED DESCRIPTION OF THE INVENTION

Figure 1:
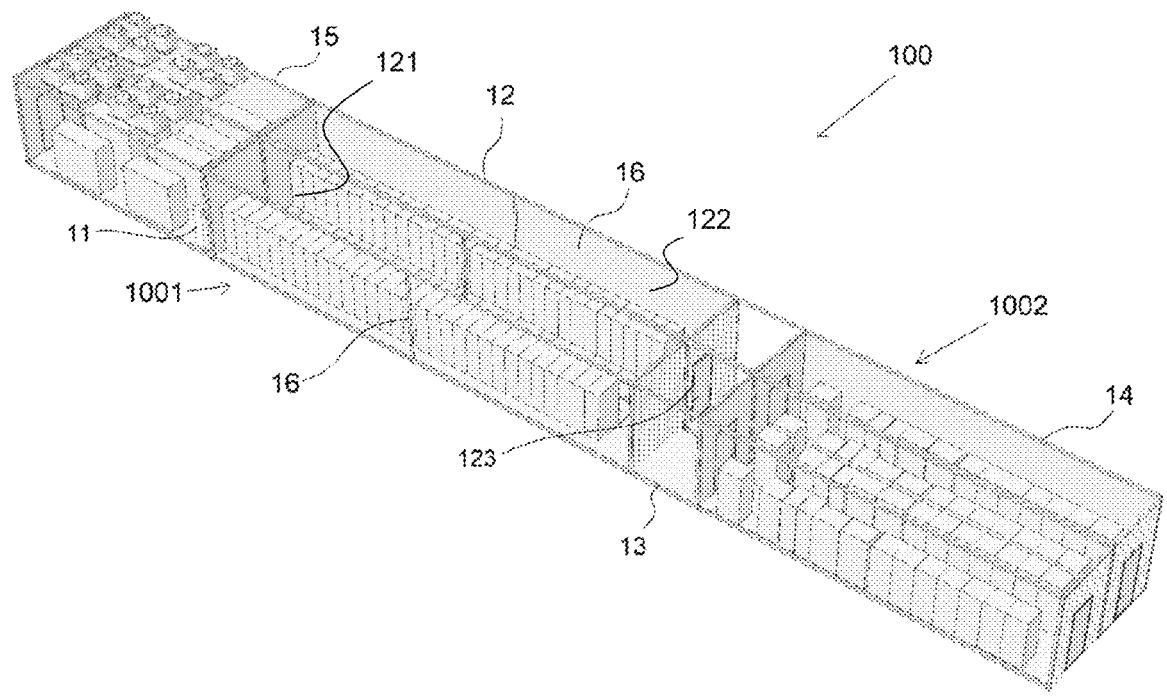
FIG. 1 shows a perspective view of a data center module that is the basis of the present invention.
Figure 2:
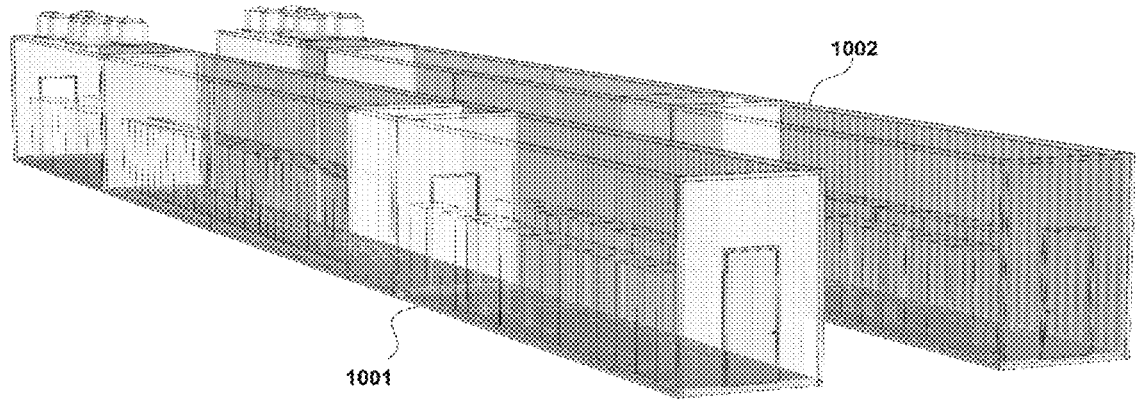
FIG. 2 shows an exploded perspective view showing the two halves of the module of the present invention.

FIG. 1 shows a data center module (100) that is the basis of the present invention. The module (100) is constituted by joining a first half (1001) with a second half (1002), which are substantially symmetrical.

Figure 4:
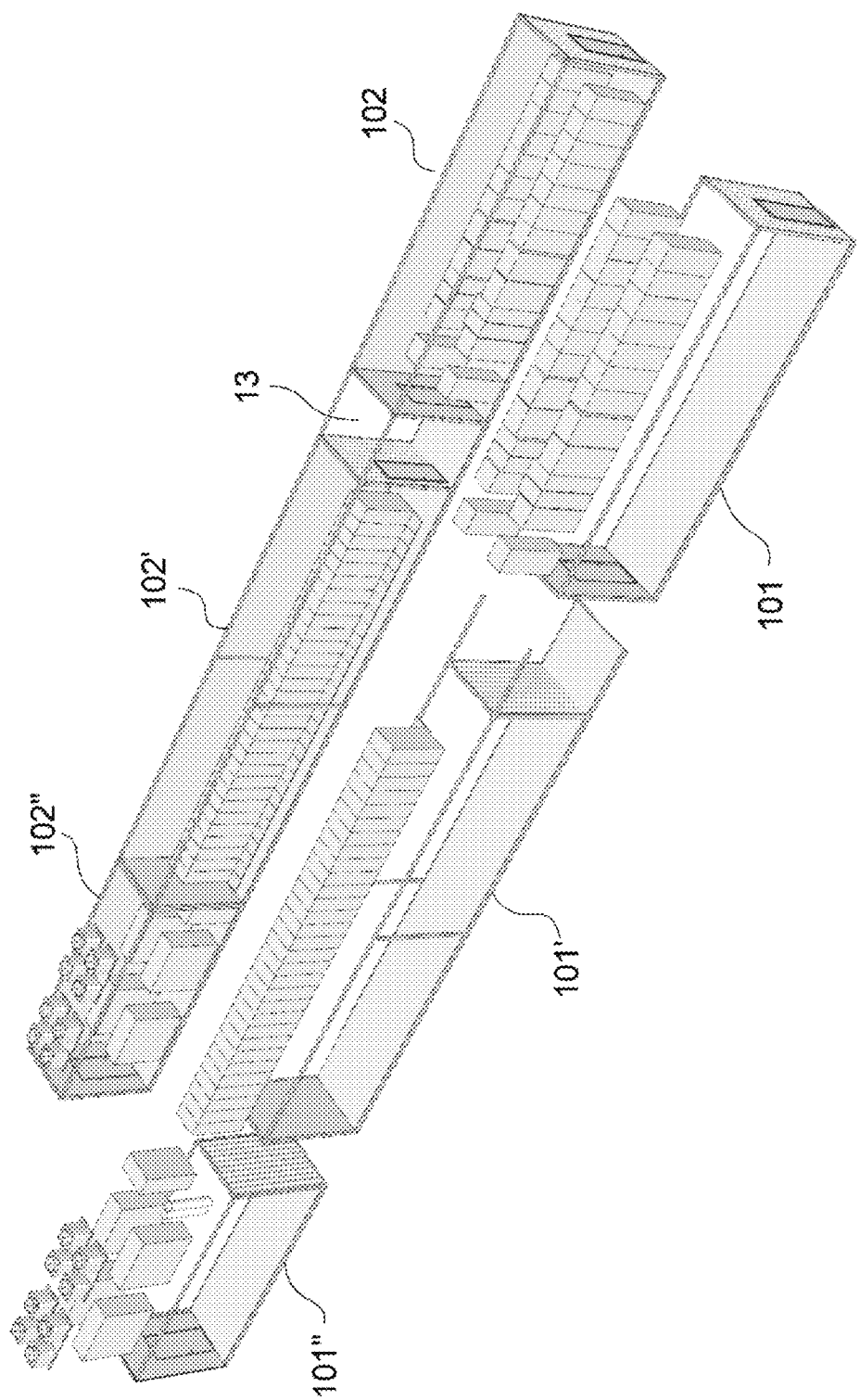
FIG. 4 shows an exploded perspective view of a module of the present invention, with the segments in detail.
Figure 5:
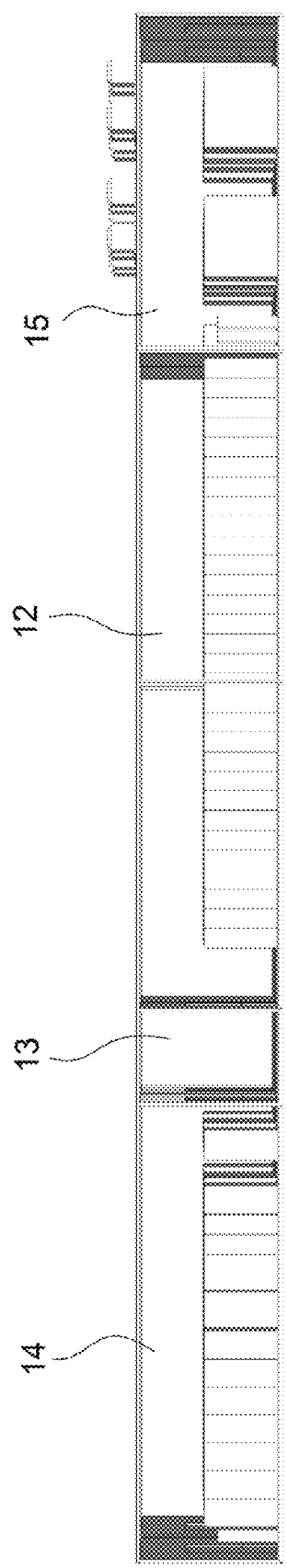
FIG. 5 shows a side view of a module of the present invention.
Figure 6:
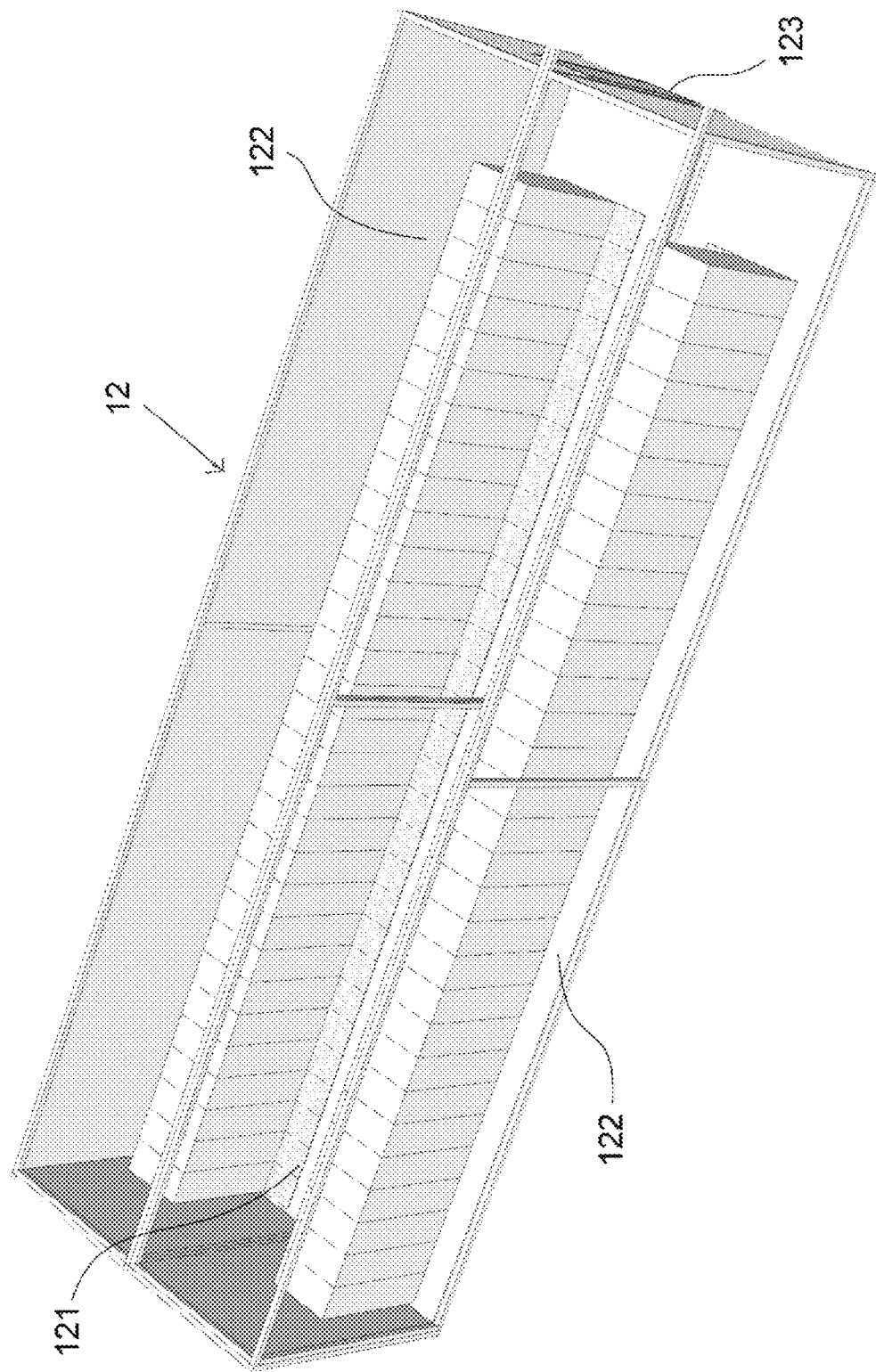
FIG. 6 shows a detail view of the racks area with an exemplary configuration of the hot-cold aisle layout.
Figure 7:
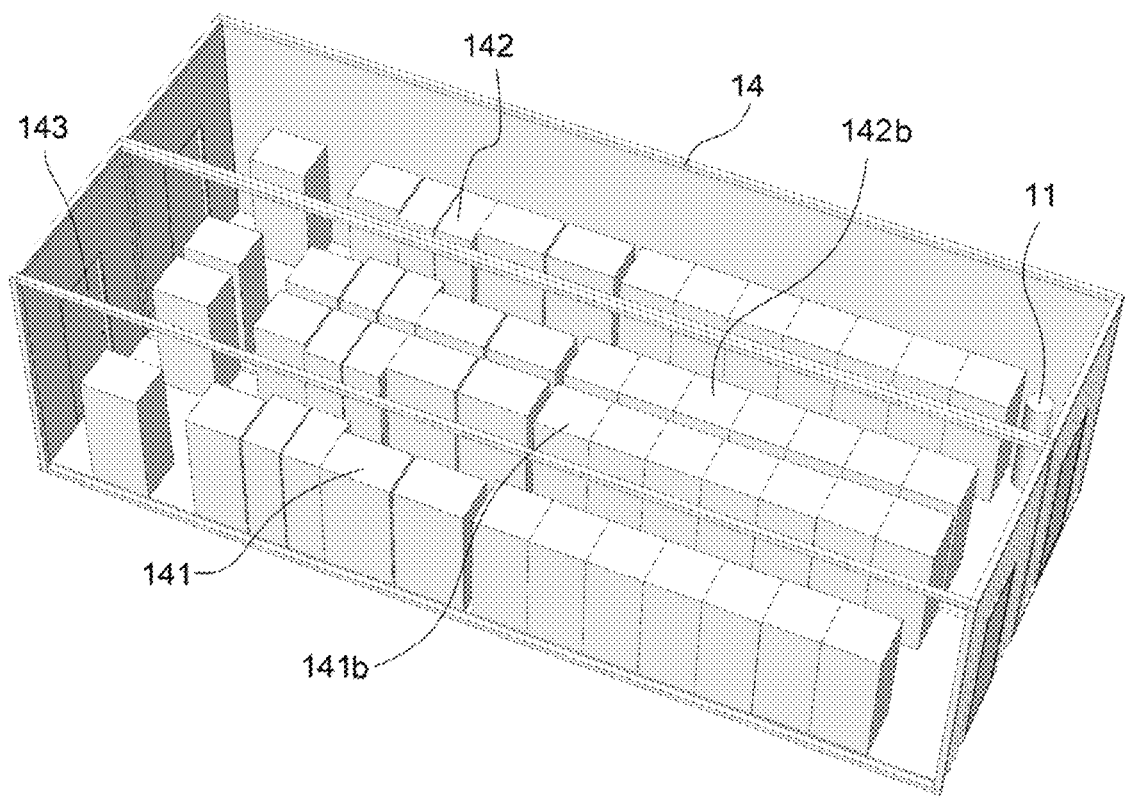
FIG. 7 shows a view of details of the electricity supply system.

As shown in FIG. 4, each of the halves (1001, 1002) is formed by joining one or more prefabricated and transportable segments (101, 102). The segments (101, 102) are prefabricated in dimensions according to the jurisdiction through which the segments will be transported.

The segments (101, 101', 101") are joined to form the first half (1001) of the module (100). Likewise, the segments (102, 102', 102") are joined to form the second half (1002) of the module (100).

The construction of these segments (101, 102) is carried out in an appropriate location, such as a factory. A dedicated manufacturing location renders more efficiency in their construction, being much more advantageous than construction at the data center installation location, and actions can take place in parallel with the construction location preparations, thus optimizing the total work time.

As mentioned, the module (100) is constituted by joining the first half (1001) with the second half (1002) providing a common and unique space for the racks area (12), like a conventional data center. This arrangement allows the use of a hot (121) and cold (122) containment aisle (or vice versa), as shown in FIG. 1.

Figure 3:
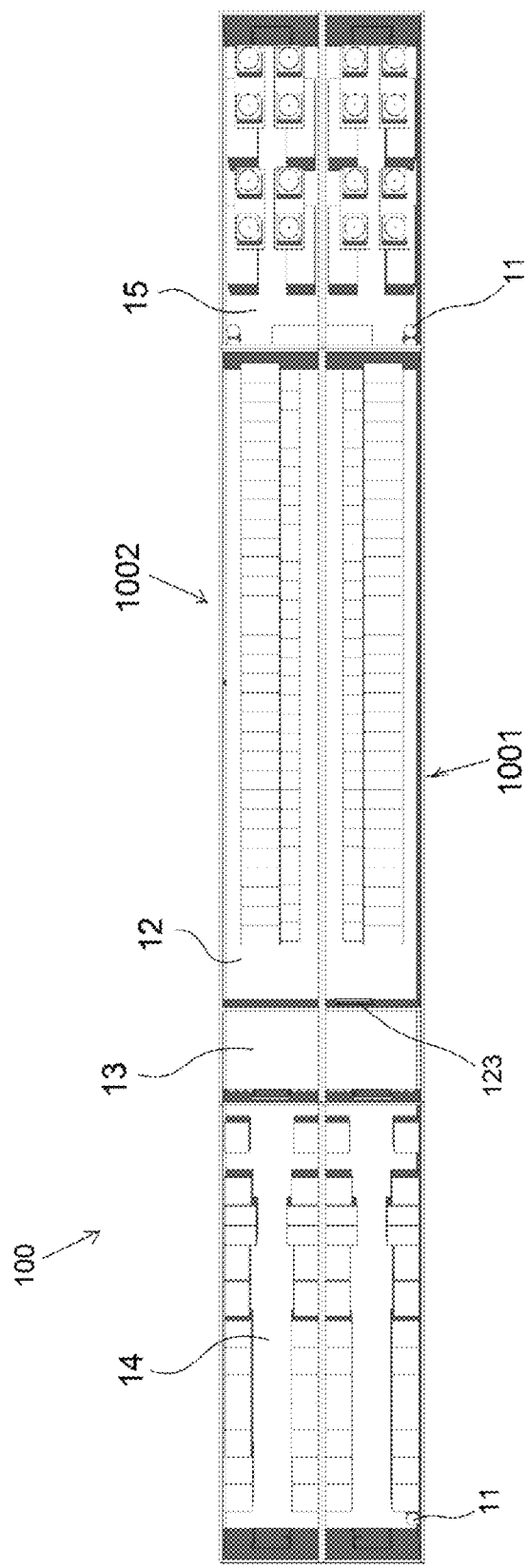
FIG. 3 shows a top view of a module of the present invention.

It can be seen in FIGS. 1 and 3 a room for IT equipment, that is, a racks area (12), a room for the dedicated cooling system (15), a fire suppression system (11), an aggregation aisle (13), and a room with a power supply system (14).

Figure 12:
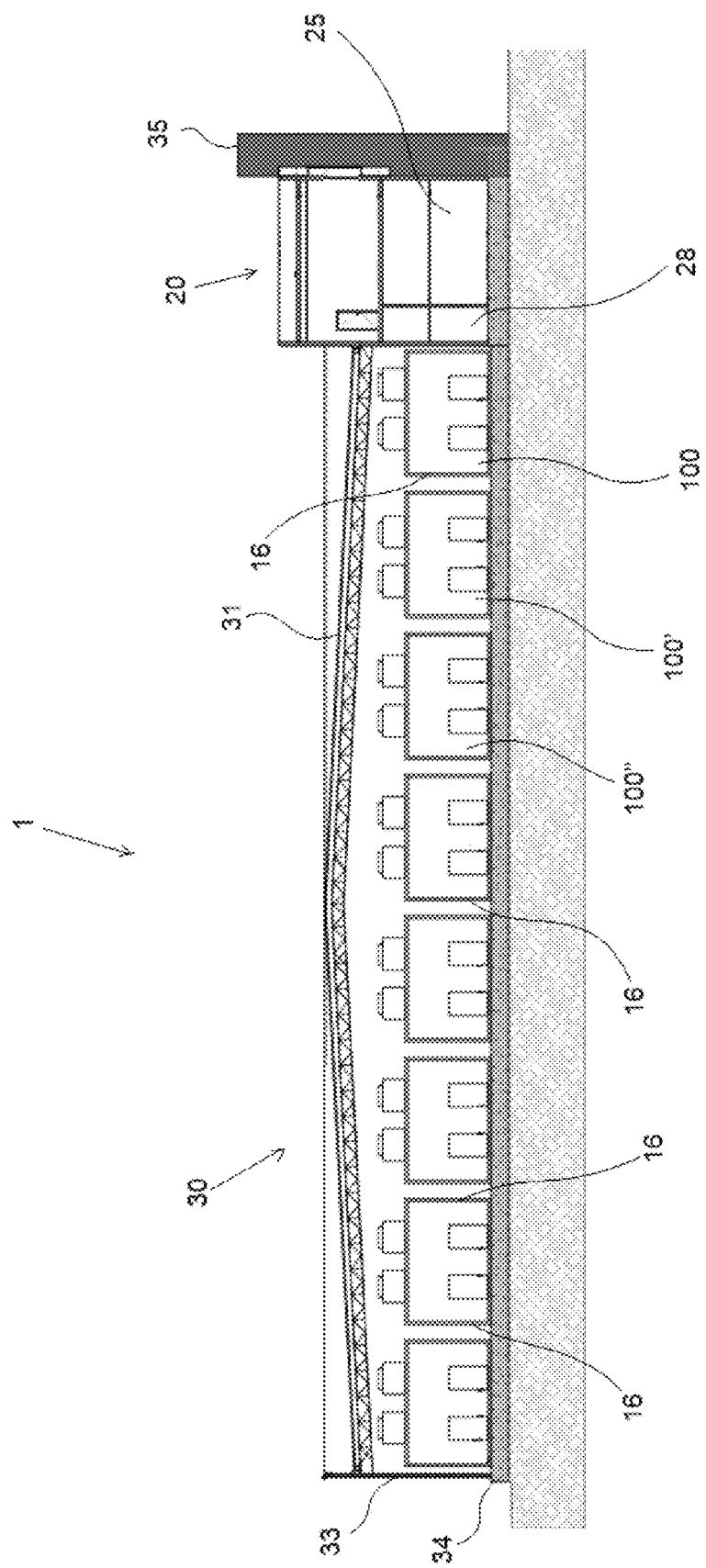
FIG. 12 shows a longitudinal sectional view of a data center of the present invention, in which it is possible to visualize the facade and auxiliary areas of the data center on the right and, on the upper part, the cover of the housing.

As shown in FIG. 12, by twinning and combining the modules (100) a modular data center (1) is obtained, functionally equivalent to a conventional data center in essence.

In order to improve logistics, the segments (101, 101', 101", 102, 102', 102") are constructed with dimensions that do not exceed the cargo standards of a jurisdiction. Thus, the transport of segments (101, 102) can be carried out without the need for special authorizations from transport regulatory bodies of a jurisdiction, except for a special project that, perhaps, exceeds the cargo standards.

In many jurisdictions, transporting of non-standard cargo (exceeding regulatory dimensions) requires, in addition to special authorizations, strict compliance with rules, such as overnight transport (from 3:00 am to 6:00 am, for example), special signs, escorts, among other rules, which make logistics difficult, delay and make the construction of modules (100) of a data center more expensive.

In an embodiment of the invention, the segments (101, 101', 101", 102, 102', 102") are constructed from a container-like structure.

Containers are particularly advantageous for logistics, as they are already adapted to be transported by ships, trains and trucks. Many jurisdictions accept the container as standard cargo, which facilitates logistics of the segments (101, 101', 101", 102, 102', 102").

For example, the containers (compatible with the dimensions of a segment) have approximate dimensions of 6 meters (20 ft) long, 2.4 meters (7.9 ft) wide, 2.6 meters (8.5 ft) tall, and a maximum capacity of 24,000 kg (52,910.9 pound), typical characteristics of a 20 feet container. Another standard container (40 feet), approximately 12 meters long, and the other dimensions like the standard 20 feet container.

The composition of the module (100) by means of segments (101, 101', 101", 102, 102', 102") prefabricated within the cargo standards of a jurisdiction is very advantageous, providing a quick construction of a data center (1) at low cost.

Additionally, the segments (101, 101', 101", 102, 102', 102") are joined at the construction location of the data center (1) to form its respective halves (1001, 1002).

Finally, the joining of the halves (1001, 1002) forms a module (100) that is the base infrastructure of the data center (1) of the present invention, having advantages in terms of cooling efficiency and redundancy.

The module (100) is substantially symmetrical, considering a longitudinal plane substantially perpendicular to the ground.

The segments (101, 101', 101", 102, 102', 102") of the respective halves (1001, 1002) are joined first. After each of the halves (1001, 1002) is ready, the halves are joined together, forming a module (100).

The modules (100) are then comprised of two substantially symmetrical halves (1001, 1002) which are joined at the data center (1) construction location.

In some preferred embodiments of the invention, a half (1001, 1002) may consist of 2 to 4 pairs of segments (101, 101', 101", 102, 102', 102"). Each of these segments (101, 101', 101", 102, 102', 102") is transported on a lorry and joined at the data center (1) construction location.

The module (100) is symmetrical in the longitudinal direction, and this is another advantage of the present invention, since it is possible to construct modular data centers (1) having high cooling capacity and redundancy (both thermal and electrical).

The joining of two symmetrical halves (1001, 1002) to form the racks area (12) provides a large room, similar to the internal area of a conventional data center (1), with separation of hot air (121) and cold air (122) aisles.

The feature of having at least two symmetrical halves (1001, 1002) provides greater mass of air conditioning available inside the racks area (12) of a module (100) of a data center (1).

The thermal capacity of air depends on its mass. On the other hand, the mass of air under conditions of standard temperature and pressure (STP) increases proportionally with its volume. Thus, the greater the volume of air, the greater its thermal capacity in the racks area (12).

Thus, a greater volume of the racks area (12), provided by joining the symmetrical halves (1001, 1002), leads to a greater cooling capacity and thermal stability of the air in the racks area (12). This means that it is easier to keep the temperature constant within the racks area (12) of a module (100). That is, a longer time and/or a greater amount of heat are required for the temperature variation.

This is particularly advantageous, for example, when there is a momentary failure in the cooling system, and the temperature varies little not causing damage to the operation of the IT equipment present in the racks.

Said failure can be caused, for example, by a failure in the electricity supply of the local electric utility. In these cases, in an interruption in the supply of electricity only to the cooling equipment, there is enough time for a generator to start, without compromising the functioning of the IT equipment.

The separation of the hot (121) and cold (122) air aisles and the use of aisle enclosures therefore refer to the optimization of use of air for cooling the IT equipment present in the module (100).

The data center modules are a solution already found in prior art, in which the enclosure of the hot aisle is usually used.

The module (100) of the present invention is equipped with a cooling system (15) dedicated and segregated in its own area, in order to mitigate risks arising from possible failures, fires, short circuits, among other failures of said cooling system (15).

Another advantage of the halves (1001, 1002) being symmetrical is the increase in redundancy and the possibility of sharing of technical areas, that is, the sharing of the cooling system (15) and the power supply system (14), optimizing the use and potentially the redundancy of equipment and systems.

Each of the halves (1001, 1002) is completely autonomous. In principle, only one half (1001) could work alone, that is, without the need for its other mirrored half (1002).

Although this possibility exists, for only one of the halves (1001, 1002) to work, it is disadvantageous.

The configuration wherein one of the halves (1001, 1002) works alone does not provide an increase in the thermal capacity of air in the racks area (12), nor does it even increase the redundancy of the cooling system (15) and the power supply system (14).

With the symmetrical halves (1001, 1002) connected, redundancy is increased, since in the cooling system (15) there is one or more cooling equipments in operation and one or more cooling equipment in standby (redundancy). If one of the cooling equipments in operation fails for some reason, one or more equipments that were in standby (backup) starts up.

Figure 8:
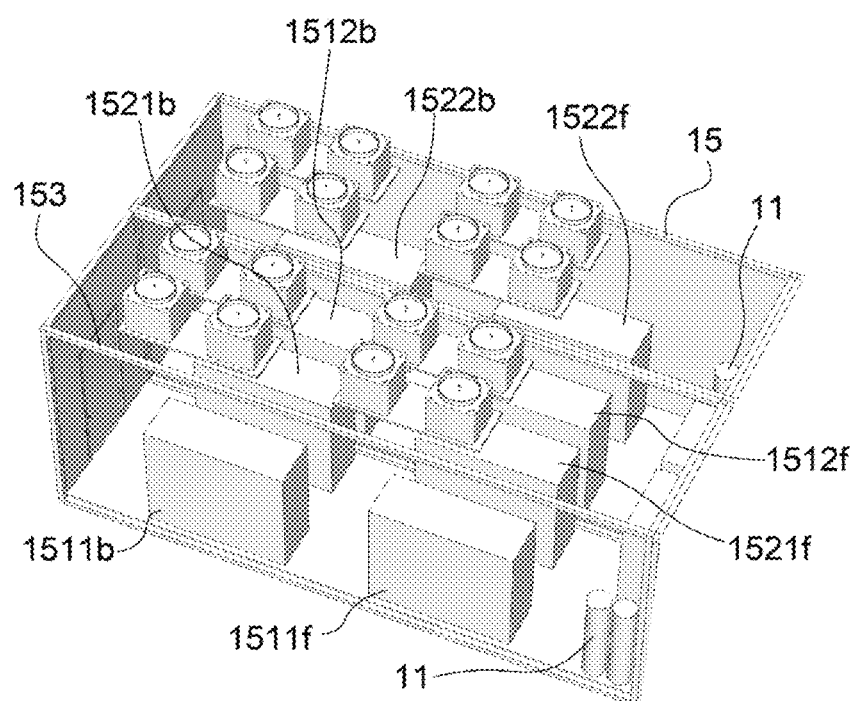
FIG. 8 shows a view of details of the cooling system, highlighting the redundancy optimization.
Figure 9:
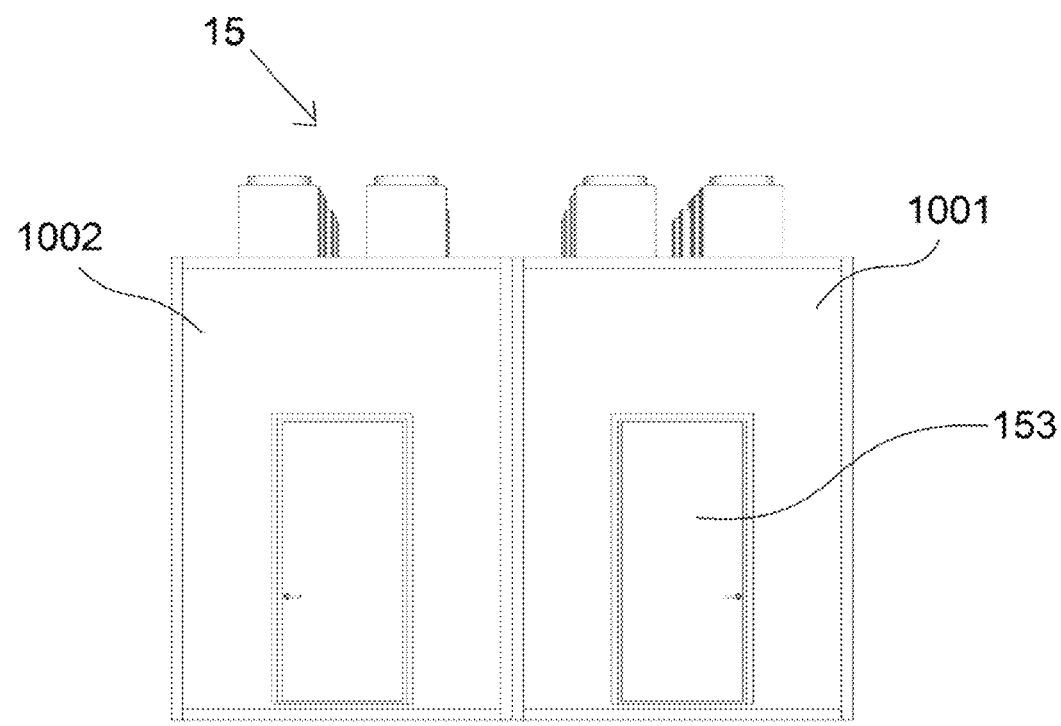
FIG. 9 shows a side view of the module of the present invention, with detail for the cooling system.
Figure 10:
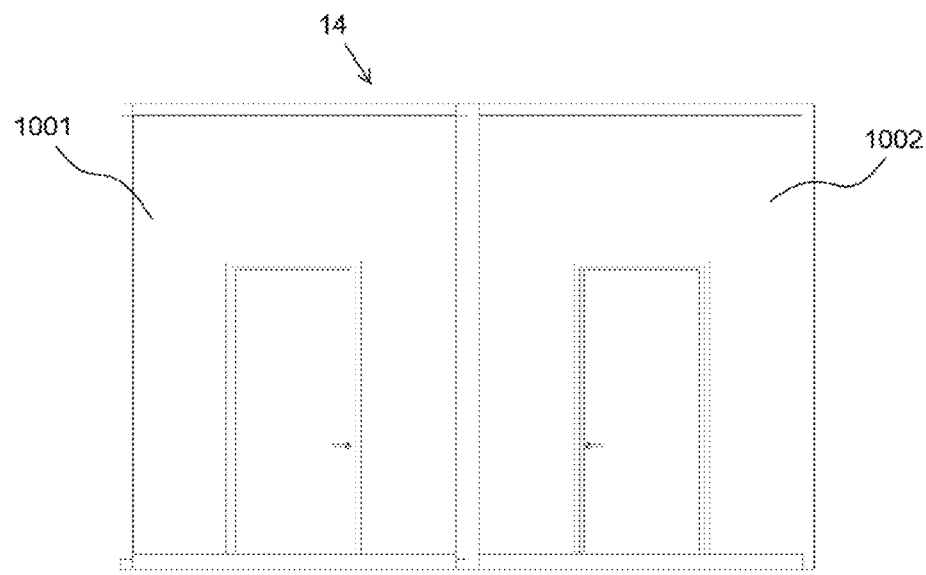
FIG. 10 shows a side view of the module of the present invention, with the electrical power supply system in detail.
Figure 11:
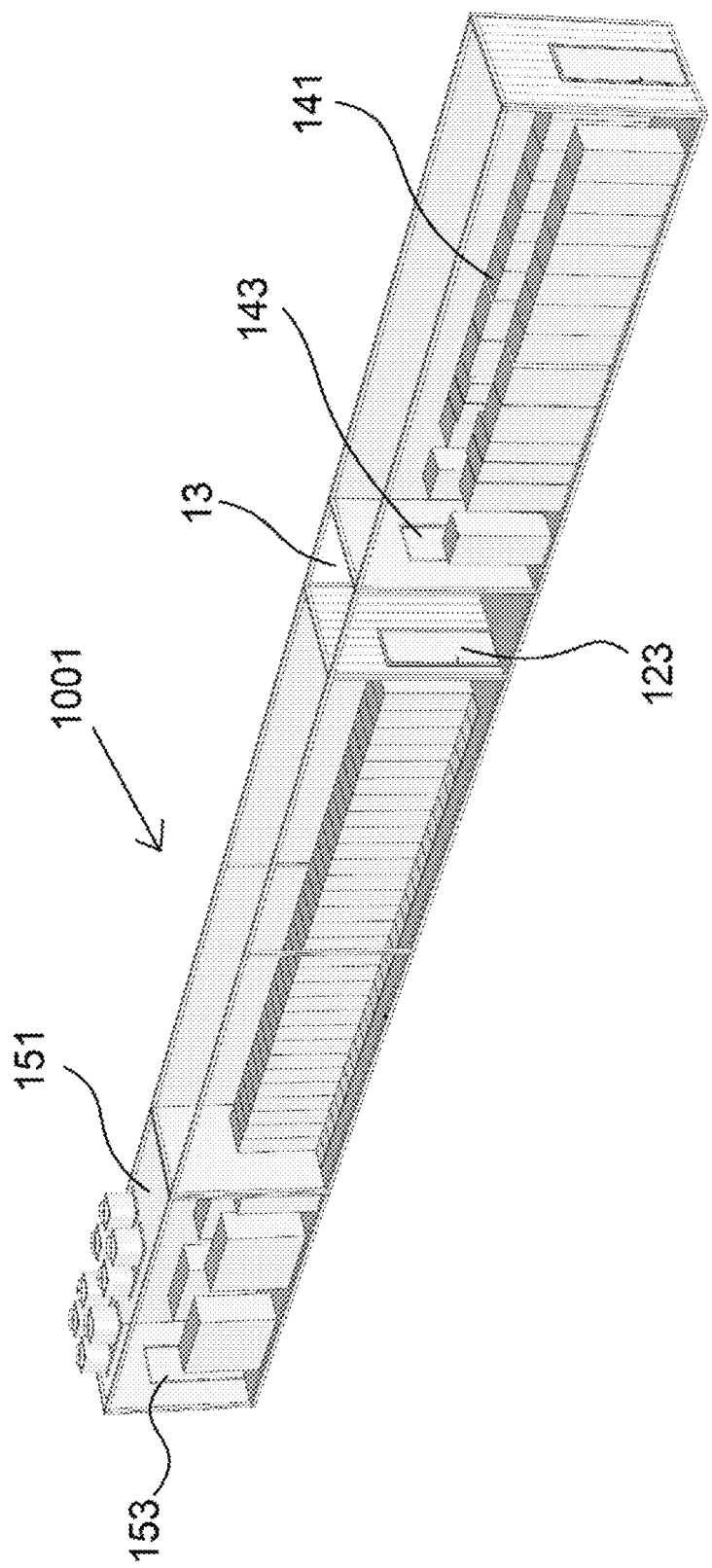
FIG. 11 shows a view of a half of the module of the present invention.

In one embodiment of the present invention, shown in FIG. 8, each of the halves (1001, 1002) has its respective cooling system (151, 152).

For example, as shown in FIG. 8, the cooling system (151) of the first half (1001) comprises two devices (1511f, 1521f) running and two devices (1511b, 1521b) in standby. The same arrangement is found in their respective symmetrical cooling system (152), that is, in the second half (1002).

If the cooling equipment (1511f) fails, the cooling equipment (1511b, 1521b) of its half (1001) is available as an option (backup) that is in standby. As the halves (151, 152) are integrated, in addition to the cooling equipment (1511b, 1521b) there is also the cooling equipment (1512b, 1522b) of the other half. This makes the cooling system (15) very robust, redundant and reliable.

The same redundancy logic applies to the power supply system (14) and fire suppression systems (11). Therefore, the power supply systems (141, 141b, 142, 142b) of each of the halves (1001, 1002) supply the other half in case of failure, with the same logic as the cooling system, that is, even using the respective power supply backup systems (141b, 142b).

Thus, the data center (1) of the present invention consists of one or more modules (100) having an exclusive area for allocation of equipment in customer racks, here called racks area (12), an aggregation aisle (13) through which the controlled circulation of personnel is carried out, and a separate technical area.

Figure 14:
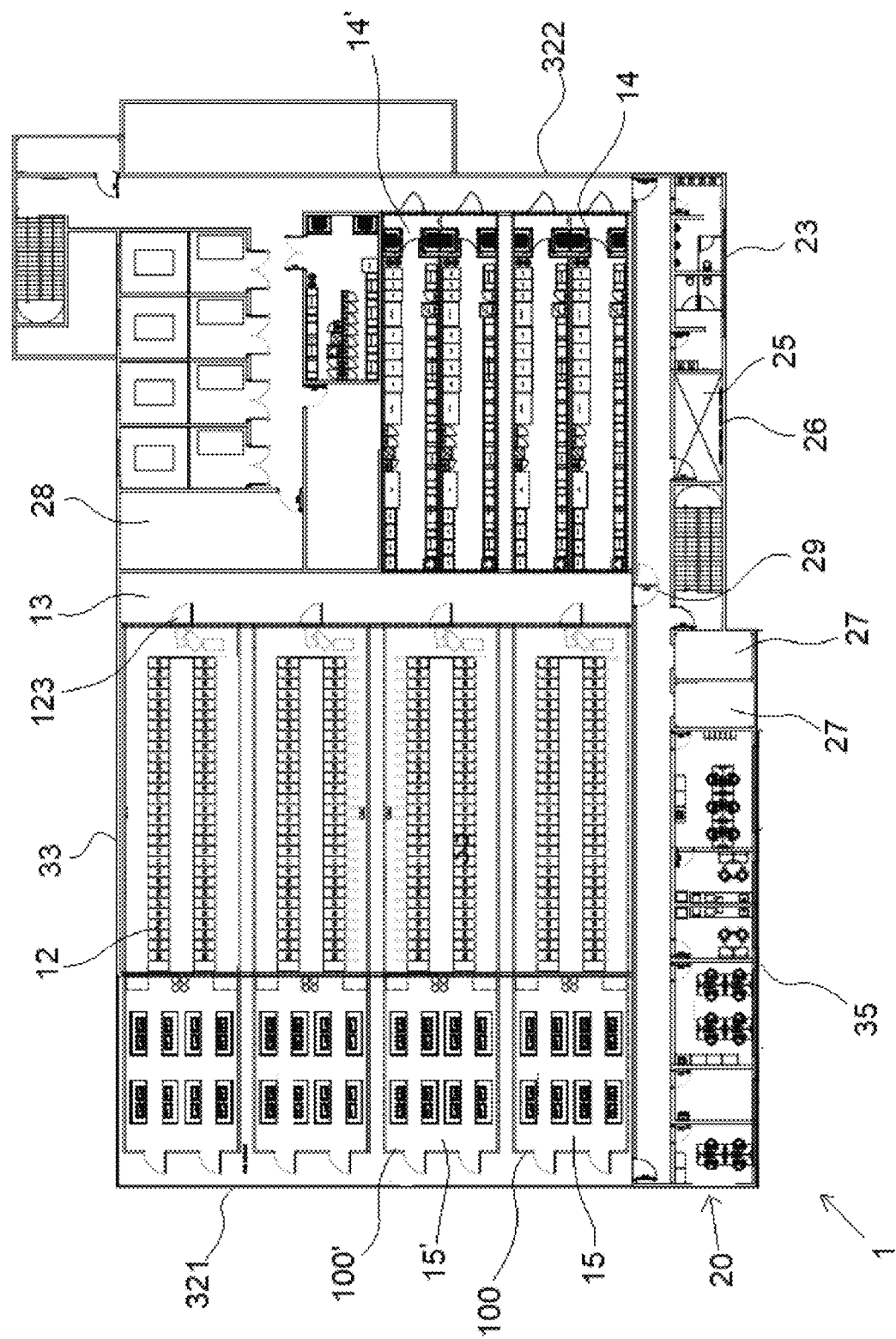
FIG. 14 shows a floor plan view of an embodiment of the data center of the present invention.

The complete independence of the modules (100) provides scalability to the data center, as the modules (100) can be joined side by side in order to increase the capacity of the data center, without incurring the immobilization of large volumes of capital at the beginning of the data center (1) operation, as shown exemplarily in FIGS. 12 and 14.

In addition, the internal arrangement of each of the modules (100) allows infrastructure redundancy, which translates into robustness, reliability and uninterrupted operation in the vast majority of postulated failures.

Data center (1) maintainability is independent of the data processing operation. This advantageous feature is achieved since each module (100) has its racks area (12) separated from the technical areas.

Access to the power supply system area (14) is preferably carried out through external access and through the main aggregation aisle (13), and access to the cooling system (15) is carried out through the side access third door (153), which may or may not have an aisle. The cooling system (15) is preferably without the top cover of the data center housing to aid convection of air from the cooling system (15).

Thus, through the access second door (143) to the area of the power supply system (14) it is possible to carry out its maintenance without the need to even circulate through the racks area (12) of the module (100). Access second door (143) is preferably a door having access control (e.g. by biometrics, password, tags, token, etc.).

As shown in FIG. 1, the racks area (12) can also be reached for maintenance through an exclusive access, which preferably is a door (123) having access control (e.g. by biometrics, password, tags, token, etc.).

The modules (100) are externally constructed of an armored, water jet proof, fire resistant and substantially metallic structure.

The method of building the module (100) consists of joining one end of the segment (101) to its respective adjacent segment (101') and so on, joining the next adjacent segment (101"), to form the first half (1001).

After all segments (101, 101', 101") are assembled, the first half (1001) is formed.

By joining one end of the segment (102) to its respective adjacent segment (102') and so on, joining the next adjacent segment (102"), occurs the formation of the second half (1002).

After all the segments (102, 102', 102") are assembled, the second half (1002) is formed.

After the formation of each of the halves (1001, 1002) one half is joined to the other half, thus forming the module (100).

In one embodiment of the invention, each module (100) can support up to 60 racks of 600 mm (2 ft.) wide each and 600 kVA of electrical power. However, other embodiments are possible, where these specifications can change according to rack size and electrical density customization required.

FIG. 12 exemplifies an embodiment of the data center (1) of the present invention, showing its interior. The arrangement of modules (100, 100', 100") side by side is evident, in order to increase (expand) the capacity of the data center (1), without discontinuing its operations.

The method of building a module further comprises one or more modules (100, 100', 100") arranged side by side and interconnected from the larger side faces (16) of adjacent modules, wherein the main aggregation aisle (13) is aligned between the modules (100, 100', 100").

Expansion can be carried out gradually, without the need for a large initial investment, as with conventional data centers.

FIG. 14 shows the common aggregation aisle (13). At the same time that the aisle (13) is integrated, it preserves maintainability, including access through independent first doors (123) for each racks area (12) of each of the modules (100, 100'). The racks area (12) is also known as the data hall.

The aggregation aisle (13) creates a usability for customers like a conventional data center, where they can circulate to access the power equipment areas (14), racks area (12) and convenience services areas. (20).

As shown in FIG. 14, access control (29) to the aggregation aisle (13) is preferably carried out through the convenience services areas (20). In an embodiment of the invention, exemplary access is granted by the reception area (25). The reception area (25) grants access by user profile, which can access one or more racks areas (12), or only one or more power supply areas (14, 14'), or even access both areas. Access controls may also allow access to the cooling system (15, 15').

Figure 15:
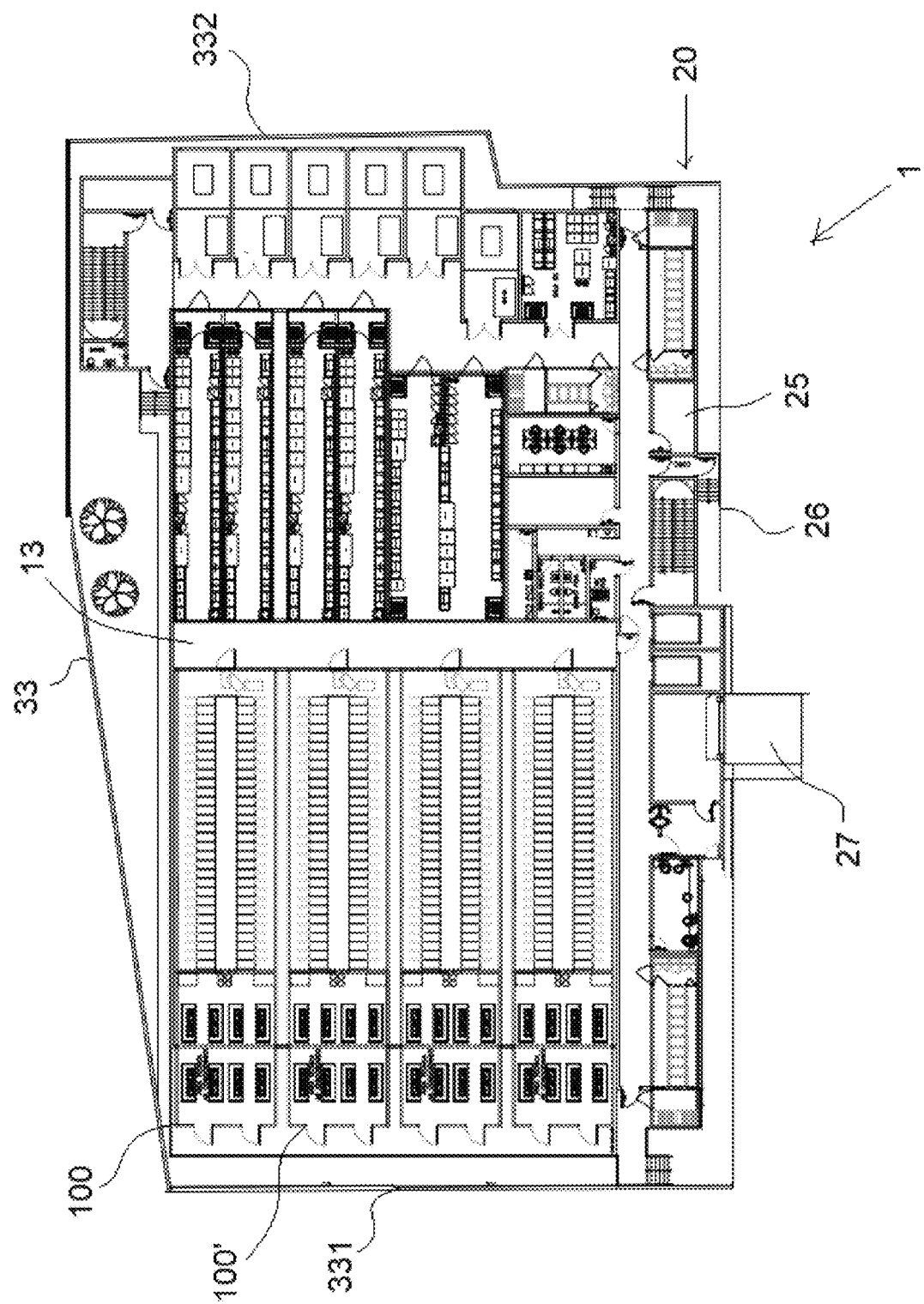
FIG. 15 shows the floor plan view of another embodiment of the data center of the present invention.
Figure 16:
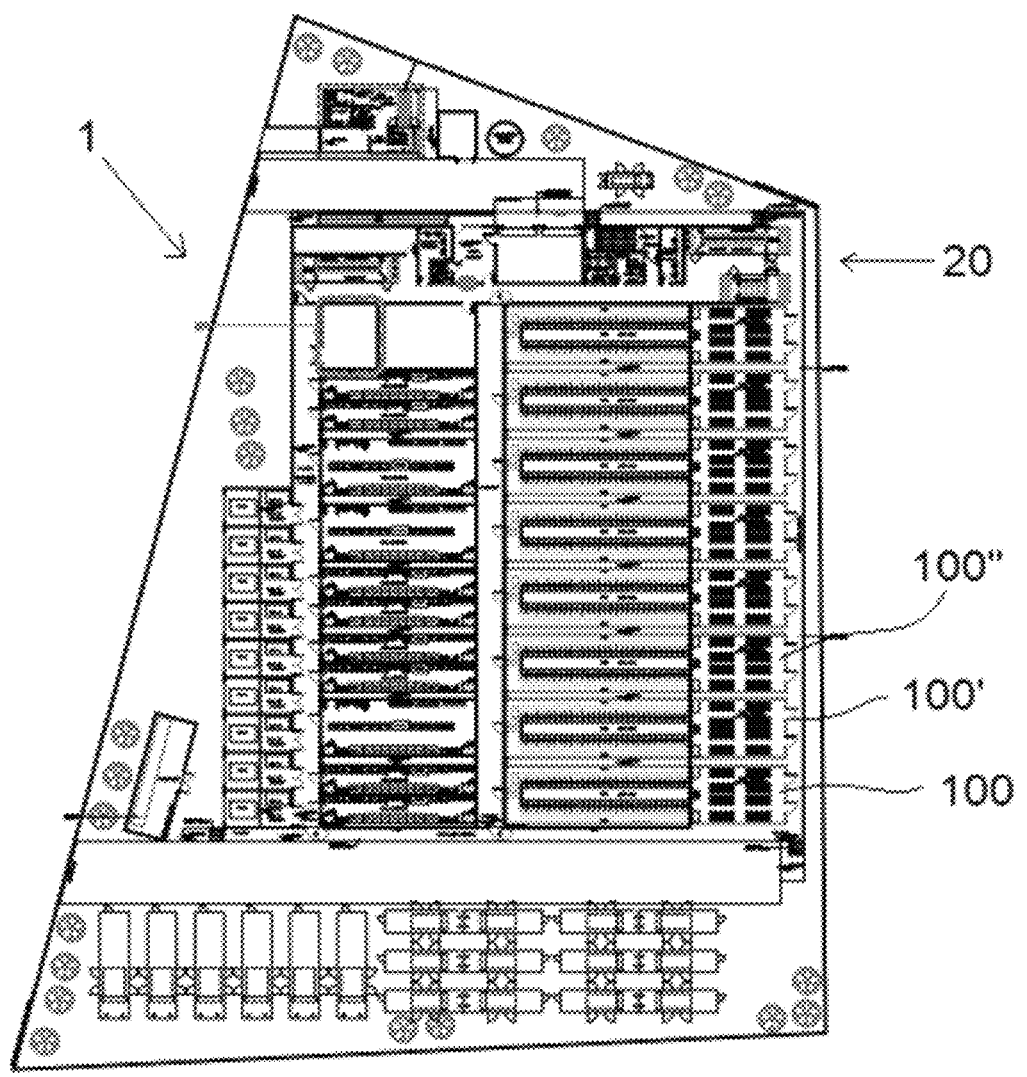
FIG. 16 shows the floor plan view of another embodiment of the data center of the present invention.

Thus, the circulation of users occurs preferably through the convenience services areas (20), which can have different dispositions, as shown in FIGS. 15 and 16.

The convenience services areas (20) are, for example, the docks (27), reception area (25), testing room, stock area (28), and meeting room, among others.

By aggregating the convenience services areas (20), a layout that can be compared to a conventional data center is obtained. The convenience services areas (20) are preferably built using masonry.

FIG. 14 shows another embodiment of the invention, that is, a data center (1) having modules (100, 100') positioned side by side, which joined together form a data center (1) having all the advantages of a conventional data center.

FIG. 12 shows a longitudinal section view of an embodiment of the invention. A housing (30) provides structural and visual integration, which protects the modules (100) from the weather, in addition to providing access security.

This housing (30) allows for the optional addition of customizable convenience services areas, and office and storage areas.

The housing (30) consists of a cover (31), preferably metallic, above the modules (100), preferably masonry walls on the sides (321, 322), with the bottom (33) preferably having access to the introduction of modules (100). At the bottom, the housing (30) consists of a floor (34), preferably raised. The convenience services area (20) is integrated into the housing (30) in order to form the same set of data center (1). The cover (31) preferably does not cover the cooling systems (15) or the generators. The convenience services area (20) also has a facade (35).

Figure 13:
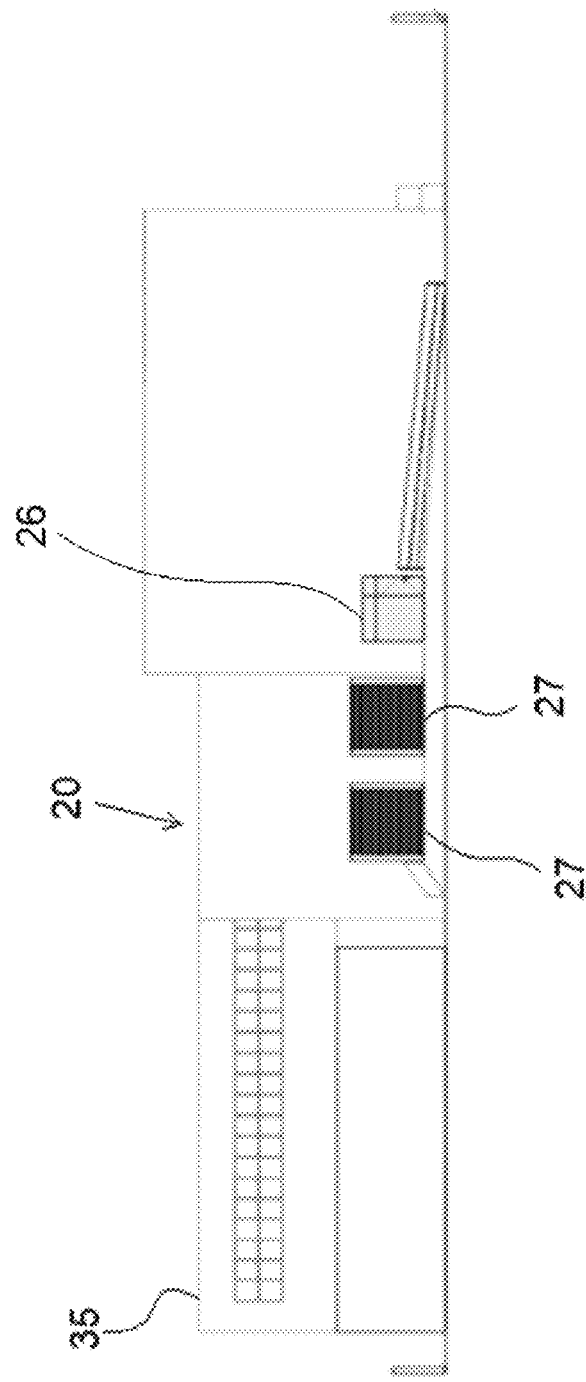
FIG. 13 shows a front view of the facade of the modular data center in an embodiment of the invention, wherein the facade emulates a conventional data center.

FIG. 13 shows a front view, i.e. the main entrance (26) for users (customers and employees) of the data center. The aspect and functions are like a conventional data center, having all its technical advantages, but with the flexibility of a modular data center.

The present invention provides an outer structure capable of housing a large amount of customer IT equipment in racks, having capacity for power and cooling to support a wide range of energy density per rack, meeting the specifications of the TIA-942 Rated-3 standard from the Telecommunications Industry Association (renowned standardization body in the telecommunications and information technology area), having a modular structure, but allowing for the experience of users of a conventional data center.

For connection between modules (100) and perfect integration with the other areas of the data center (1), an aggregation aisle (13) was created. In addition to the lack of infrastructure equipment in the aisle (13), such aisle (13) is integrated with the convenience services areas (20), such as a reception area (25), stock area (28), and docks (27), among others, becoming a circulation aisle for people, employees, customers and other users.

Regarding to composition of the module (100), it is shielded, water jet proof, fire resistant, having capacity for dozens of racks, and an access door (123, 143, 153) for biometric identification and/or card reader.

The modules (100) are combined to the infrastructure in a practical way, enabling scalability of space and energy capacities by simply adding the modules in parallel.

The data center (1) of the present invention allows electrical connectivity of the equipment installed in the racks, having redundancy in the supply of electrical power, uninterrupted monitoring of the entire infrastructure, in addition to monitoring with recording of internal and external images by surveillance CCTV cameras having night vision and motion sensor.

One of the advantages of the present invention is the preventive maintenance, which can be carried out by direct access to infrastructure equipment, avoiding direct contact with the IT equipment of the customer, which ensures greater stability and operational security.

Another advantage of the present invention is the use of an outer housing (30), which shelters the entire structure, protecting it against direct sunlight, and improves the efficiency of cooling equipment, reducing power consumption. Furthermore, the outer housing (30) of the modular data center (1) of the present invention provides complete access control thereto.

In other words, the outer housing (30) protects and structurally integrates the internal parts and other external protective items of the modules, such as walls, providing an overall infrastructure similar to a conventional data center.

The data center (1) of the present invention, in addition to facilitating the process of planning and executing the construction, together with other units, provides a reduction in installation time, and it is even possible to obtain a data center (1) of large size, without compromising energy efficiency in relation to similar existing data centers from prior art. In other words, the present invention allows the construction of scalable data centers (1), even obtaining the capacities of the large data centers (1).

FIG. 17 is a flowchart illustrating the steps of a construction method for a data center, wherein, comprising the steps:
a) Construction (40) of the housing, constructed from execution of the following sub-steps performed in any order:
  construction (41) of a solid base or floor raised from the ground where the data center will be constructed;
  construction (42) of the convenience services area;
  construction (43) of the cover structure;
  placement (44) of the cover or use of an existing one;
  implementation (45) of side closures;
  bottom closing (46);
b) Insertion (50) of the segments inside the housing, which are constructed from the execution of the following sub-steps performed in any order:
  first segments are joined (51) to form a first half;
  segments substantially symmetrical to the first segments are joined (52) to form a second half substantially symmetrical to the first half,
  after formation of each of the halves, a first half is joined (53) to the second half, forming the module;
c) The modules are arranged side by side (60) inside the housing to form the modular data center.

The invention claimed is:

1. A data center module formed from prefabricated and transportable segments, wherein the module has a substantially parallelepiped shape;
  wherein at a first end of the module, the first end includes a dedicated and segregated power supply room that houses a power supply system and is in the substantially parallelepiped shape;
  wherein at an second end of the module opposing the first end of the module, the second end includes dedicated and segregated cooling system room that houses a cooling system and is in the substantially parallelepiped;
  wherein the module is formed by joining a first half and a second half of the module, wherein the first half and the second half are substantially symmetrical with respect to a longitudinal plane perpendicular to a floor, with each half being further formed by joining one or more respective prefabricated and transportable segments; and
  wherein between the power supply system room and the cooling system room the module is provided with a main aggregation aisle and a dedicated and segregated room to house a rack area;
  wherein the main aggregation aisle is a transversely arranged circulation corridor; and
  wherein a first door having access control is provided for accessing the racks area, allowing circulation of authorized users between the main aggregation aisle and the racks area, and a second door having access control is provided for access to the power supply equipment, allowing circulation of authorized users between the main aggregation aisle and the power supply system room.

2. The data center module formed from prefabricated and transportable segments, according to claim 1, wherein the access to the main aggregation aisle is also controlled and carried out through a convenience services area.

3. The data center module formed from prefabricated and transportable segments, according to claim 1, wherein the joining between the first half and the second half forms a hot air or cold common containment aisle.

4. The data center module formed from prefabricated and transportable segments, according to claim 1, wherein each of the halves is autonomous and shares the cooling equipment from each other.

5. The data center module formed from prefabricated and transportable segments, according to claim 4, wherein each of the halves can share standby cooling equipment from each other.

6. The data center module formed from prefabricated and transportable segments, according to claim 1, wherein each of the halves is autonomous and shares the power supply systems from each other.

7. The data center formed from the module of claim 1, wherein said data center comprises one or more modules arranged side by side
   wherein the modules each contain two larger length sides;
   wherein the modules are interconnected from the larger length side faces of the adjacent modules; and
   wherein the main aggregation aisle is aligned between the modules.

8. The data center according to claim 7, wherein a first module of the data center is arranged next to the convenience services area, and wherein a user access control to one or more modules is performed through the convenience services area.

9. The data center according to claim 7, wherein the data center has a housing limited, at the bottom, by a floor wherein the data center is installed;
   wherein the housing is limited at the top by a cover and houses the data center in whole or in part;
   wherein the housing is limited laterally and at the bottom respectively by closures;
   wherein at least one of the closures is carried out using gates compatible with the dimensions of the segments;
   wherein the housing is frontally limited by the convenience services area;
   wherein the convenience service area is integrated into the housing to constitute the same set of data center.

10. The data center construction method according to claim 7, wherein the method comprises the following steps in any order:
   a) construction the housing, constructed from execution of the following sub-steps performed in any order:
      construction of a solid base or raised floor where the data center will be constructed;
      construction of the convenience services area;
      construction of the cover structure;
      placement of the cover;
      implementation of side closures;
      bottom closing;
   b) insertion of the segments inside the housing, wherein the segments are assembled from the execution of the following sub-steps performed in any order:
      the segments are joined to form a first half;
      segments substantially symmetrical to the segments are joined to form a second half substantially symmetrical to the first half;
      after formation of each of the halves, a first half is joined to the second half, forming the module;
   c) the modules are arranged side by side inside the housing to form the modular data center.

* * * * *

UNITED STATES PATENT AND TRADEMARK OFFICE
CERTIFICATE OF CORRECTION

| | | |
|---|---|---|
| PATENT NO. | : 12,342,493 B2 | Page 1 of 1 |
| APPLICATION NO. | : 17/985289 | |
| DATED | : June 24, 2025 | |
| INVENTOR(S) | : Marcos Vinicius Bernardes Peigo et al. | |

It is certified that error appears in the above-identified patent and that said Letters Patent is hereby corrected as shown below:

On the Title Page

Beneath "(65) Prior Publication Data
US 2023/0397360 A1 Dec. 7, 2023"

Insert item (30):
--Foreign Application Priority Data
Jun 3, 2022 (BR) ...............102022010903-6--

Signed and Sealed this
Sixteenth Day of September, 2025

Coke Morgan Stewart
*Acting Director of the United States Patent and Trademark Office*